(12) United States Patent
Watabe et al.

(10) Patent No.: US 11,049,988 B2
(45) Date of Patent: Jun. 29, 2021

(54) HIGH PHOTOELECTRIC CONVERSION EFFICIENCY SOLAR CELL AND METHOD FOR MANUFACTURING HIGH PHOTOELECTRIC CONVERSION EFFICIENCY SOLAR CELL

(71) Applicant: SHIN-ETSU CHEMICAL CO., LTD., Tokyo (JP)

(72) Inventors: Takenori Watabe, Annaka (JP); Ryo Mitta, Annaka (JP); Hiroshi Hashigami, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/740,181

(22) PCT Filed: Oct. 25, 2016

(86) PCT No.: PCT/JP2016/004691
§ 371 (c)(1),
(2) Date: Dec. 27, 2017

(87) PCT Pub. No.: WO2018/078668
PCT Pub. Date: May 3, 2018

(65) Prior Publication Data
US 2018/0315876 A1    Nov. 1, 2018

(51) Int. Cl.
*H01L 31/05* (2014.01)
*H01L 31/0224* (2006.01)
(Continued)

(52) U.S. Cl.
CPC ...... *H01L 31/0516* (2013.01); *H01L 31/0288* (2013.01); *H01L 31/022433* (2013.01);
(Continued)

(58) Field of Classification Search
CPC ............. H01L 31/0516; H01L 31/0682; H01L 31/022441; H01L 31/02245; H01L 31/022458; H01L 31/068
See application file for complete search history.

(56) References Cited

U.S. PATENT DOCUMENTS

| 2009/0142880 A1 | 6/2009 | Weidman et al. |
| 2010/0319766 A1* | 12/2010 | Suh ............... H01L 31/0682 136/256 |

(Continued)

FOREIGN PATENT DOCUMENTS

| JP | 2006-332273 A | 12/2006 |
| JP | 2013-183004 A | 9/2013 |

(Continued)

OTHER PUBLICATIONS

SamlexSolar, "The Difference Between Solar Cell, Module & Array", http://www.samlexsolar.com/learning-center/solar-cell-module-array.aspx, 2013. (Year: 2013).*

(Continued)

*Primary Examiner* — Daniel P Malley, Jr.
(74) *Attorney, Agent, or Firm* — Oliff PLC (57) ABSTRACT

Provided is a solar cell including, on a first main surface of a semiconductor substrate having a first conductivity type, a base layer which has the first conductivity type, and an emitter layer which is adjacent to the base layer and has a second conductivity type which is a conductivity type opposite to the first conductivity type, and further including a base collecting electrode provided on at least the base layer, and a part of the base collecting electrode is also arranged on the emitter layer adjacent to the base layer on which the base collecting electrode is arranged. Consequently, the inexpensive solar cell having high photoelectric conversion efficiency can be provided.

7 Claims, 11 Drawing Sheets

(51) Int. Cl.
  *H01L 31/0288* (2006.01)
  *H01L 31/18* (2006.01)
  *H01L 31/068* (2012.01)

(52) U.S. Cl.
  CPC .... *H01L 31/022441* (2013.01); *H01L 31/068* (2013.01); *H01L 31/0682* (2013.01); *H01L 31/1804* (2013.01); *Y02E 10/547* (2013.01)

(56) References Cited

U.S. PATENT DOCUMENTS

| | | | | |
|---|---|---|---|---|
| 2011/0036397 | A1* | 2/2011 | Hemer | H01L 31/03921 |
| | | | | 136/256 |
| 2011/0041908 | A1 | 2/2011 | Harder | |
| 2011/0073154 | A1* | 3/2011 | Nishida | H01L 31/0516 |
| | | | | 136/244 |
| 2011/0073175 | A1* | 3/2011 | Hilali | H01L 31/0682 |
| | | | | 136/256 |
| 2011/0120531 | A1* | 5/2011 | Nese | H01L 31/1804 |
| | | | | 136/251 |
| 2012/0291838 | A1* | 11/2012 | Jang | H01L 31/02245 |
| | | | | 136/244 |
| 2014/0087515 | A1 | 3/2014 | Teppe et al. | |
| 2014/0174526 | A1* | 6/2014 | Pawlak | H01L 31/022441 |
| | | | | 136/256 |
| 2015/0162486 | A1* | 6/2015 | Deshazer | H01L 31/1864 |
| | | | | 438/57 |
| 2016/0225938 | A1* | 8/2016 | Feldman | H01L 31/02167 |
| 2016/0268455 | A1* | 9/2016 | Levy | H01L 31/022441 |
| 2016/0284922 | A1* | 9/2016 | Qiu | H01L 31/1864 |
| 2018/0219119 | A1* | 8/2018 | Masuko | H01L 31/0224 |

FOREIGN PATENT DOCUMENTS

| | | |
|---|---|---|
| JP | 2013-232607 A | 11/2013 |
| JP | 2015-118979 A | 6/2015 |
| TW | 200939510 A | 9/2009 |
| WO | 2014/137283 A1 | 9/2014 |
| WO | 2015/122096 A1 | 8/2015 |

OTHER PUBLICATIONS

Feb. 21, 2018 Search Report issued in Taiwanese Patent Application No. 106105343.
Oct. 23, 2018 Extended Search Report issued in European Patent Application No. 16886816.4.
Jan. 17, 2017 International Search Report issued in International Patent Application No. PCT/JP2016/004691.
May 9, 2019 International Preliminary Report on Patentability issued in International Patent Application No. PCT/JP2016/004691.
Mar. 19, 2021 Examination Report issued in Indian Application No. 201847016930.

\* cited by examiner

HIGH PHOTOELECTRIC CONVERSION EFFICIENCY SOLAR CELL AND METHOD FOR MANUFACTURING HIGH PHOTOELECTRIC CONVERSION EFFICIENCY SOLAR CELL

TECHNICAL FIELD

The present invention relates to a high photoelectric conversion efficiency solar cell and a method for manufacturing a high photoelectric conversion efficiency solar cell.

BACKGROUND ART

Figure 1:
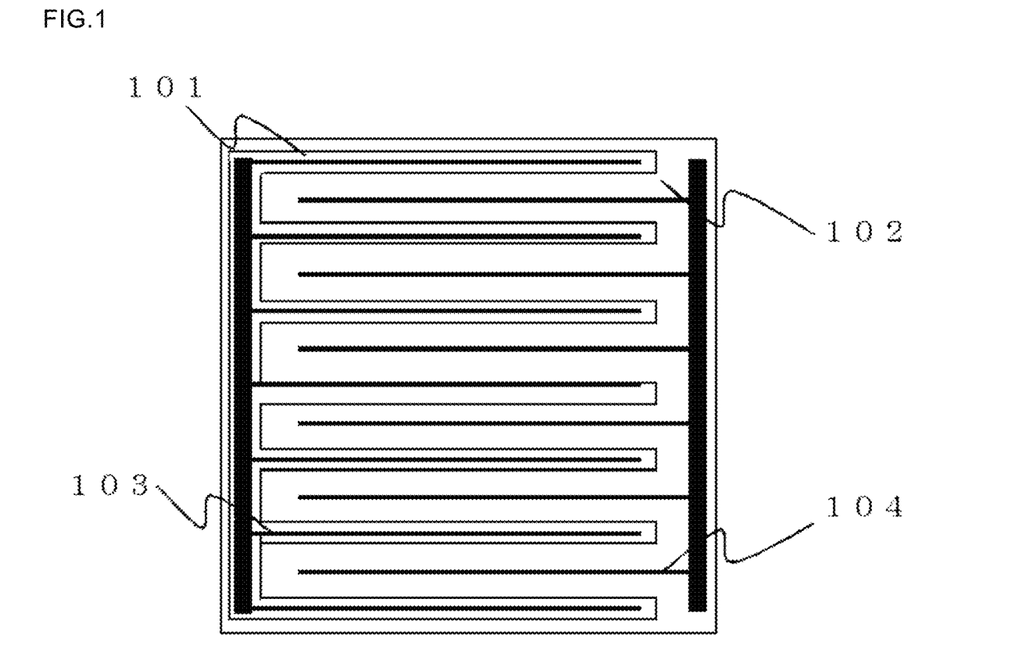
FIG. 1 is an overview diagram showing a general backside contact solar cell to which the present invention can be applied from a back surface side.

As one of solar cell structures with relatively high photoelectric conversion efficiency which use a single-crystal or polycrystal semiconductor substrate, there is a backside contact solar cell having positive and negative electrodes all provided on a non-light receiving surface (a back surface) thereof. FIG. 1 shows an outline of the back surface of the backside contact solar cell. Emitter layers 102 and base layers 101 are alternately aligned, and electrodes (103, 104) are provided on the layers along the layers, respectively. An emitter layer width is several mm to hundreds of μm, and a base layer width is hundreds of μm to tens of μm. Further, it is general for an electrode width to be approximately hundreds to tens of μm, and such an electrode is often called a finger electrode.

Figure 2:
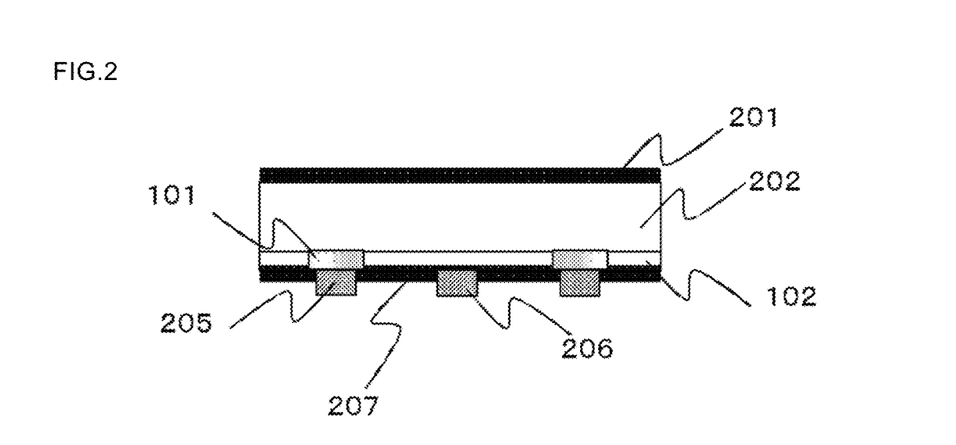
FIG. 2 is a schematic cross-sectional view of the general backside contact solar cell to which the present invention can be applied.

FIG. 2 shows a schematic view of a cross-sectional structure of the backside contact solar cell. Emitter layers 102 and base layers 101 are formed near the outermost layer of a back side of a substrate 202. Each layer thickness is approximately 1 μm at the very most. Finger electrodes (205, 206) are provided on the respective layers, and a surface of a non-electrode region is covered with a backside top coat 207 such as a silicon nitride film or an oxide silicon film. For the purpose of reducing reflection loss, an antireflection film 201 is provided on a light receiving surface side.

CITATION LIST

Patent Literature

Patent Literature 1: Japanese Unexamined Patent Application Publication No. 2006-332273

DISCLOSURE OF INVENTION

Problem to be Solved by the Invention

As one of problems in a manufacturing method of a backside contact solar cell, there is a deviation between a base layer and a base electrode. In case of forming an electrode by a printing method, since a plate elongation varies with time or in accordance with each plate, it is very difficult to stably form an electrode with a width of hundreds to tens of μm along a base layer with a width of hundreds to tens of μm as described above. To alleviate this deviation, increasing the base layer width is easiest in the manufacturing method, but it is widely known from, e.g., Patent Literature 1 that increasing the base layer width leads to a decrease in conversion efficiency. Considering a manufacturing cost, the printing method is most effective, and a method for forming electrodes with a good yield rate by the printing method while maintaining the base layer width must be established.

In view of the problem, it is an object of the present invention to provide an inexpensive solar cell with high photoelectric conversion efficiency. Furthermore, it is another object of the present invention to provide a method for manufacturing a high photoelectric conversion solar cell which can increase an allowable range of deviations of electrodes and has high productivity and a high yield rate.

Solution to Problem

To achieve the object, the present invention provides a solar cell including, on a first main surface of a semiconductor substrate having a first conductivity type: a base layer which has the first conductivity type; and an emitter layer which is adjacent to the base layer and has a second conductivity type which is a conductivity type opposite to the first conductivity type, and further including a base collecting electrode provided on at least the base layer, the solar cell being characterized in that a part of the base collecting electrode is also arranged on the emitter layer adjacent to the base layer on which the base collecting electrode is arranged.

As described above, when a part of the base collecting electrode is also arranged on the emitter electrode, a width of the base layer does not have to be increased to avoid positional deviations of the electrodes, and the solar cell with the high photoelectric conversion efficiency can be provided. Moreover, the manufacture of the solar cell is easy, a manufacturing yield is increased, and hence the inexpensive solar cell can be provided.

At this time, it is preferable for a film thickness of the base collecting electrode arranged on the emitter layer to be 0.1 to 10 μm.

As described above, when the film thickness of the base collecting electrode is 0.1 to 10 μm, a high contact resistance of the base collecting electrode and the emitter layer can be maintained, and the solar cell with good characteristics can be provided without degrading the characteristics of the solar cell.

Additionally, it is preferable for a width of the base collecting electrode arranged on the emitter layer to be 0.1 to 10 μm.

As described above, when the width of the base collecting electrode is 0.1 to 10 μm, the high contact resistance of the base collecting electrode and the emitter layer can be maintained, and the solar cell with the good characteristics can be provided without degrading the characteristics of the solar cell.

Further, it is preferable for the base layer to be arranged at a position recessed from the emitter layer, on the first main surface.

As described above, when the base layer is arranged at the recessed position, the film thickness and the width of the base collecting electrode on the emitter layer can be reduced, and the solar cell with the good characteristics can be provided.

Further, it is preferable for the emitter layer to be arranged at a position recessed from the base layer, on the first main surface.

As described above, when the emitter layer is arranged at the recessed position, the film thickness and the width of the base collecting electrode on the emitter layer can be reduced, and the solar cell with the good characteristics can be provided.

Furthermore, the present invention provides a photovoltaic module having the solar cell built-in.

As described above, the solar cell according to the invention can be included in the photovoltaic module.

Moreover, the present invention provides a photovoltaic power generation system including the photovoltaic module.

As described above, the photovoltaic module having the solar cell according to the present invention built-in can be used in the photovoltaic power generation system.

To achieve the object, the present invention provides a method for manufacturing a solar cell, including:

forming, on a first main surface of a semiconductor substrate having a first conductivity type, a base layer which has the first conductivity type, and an emitter layer which is adjacent to the base layer and has a second conductivity type which is a conductivity type opposite to the first conductivity type; and forming a base collecting electrode on the base layer, the method being characterized in that, at forming the base collecting electrode on the base layer, a part of the base collecting electrode is also formed on the emitter layer which is adjacent to the base layer.

As described above, since the high contact resistance of the base collecting electrode and the emitter layer can be maintained even though a part of the base collecting electrode is formed on the emitter layer, a positioning allowance range of the base collecting electrode can be increased. Consequently, the width of the base layer does not have to be increased to avoid the positional deviations of the electrodes, and the solar cell with the high photoelectric conversion efficiency can be manufactured. Additionally, a time required for the positioning of the electrodes can be reduced, and the productivity can be enhanced.

At this time, it is preferable for a film thickness of the base collecting electrode on the emitter layer to be 0.1 to 10 μm.

As described above, when the film thickness of the base collecting electrode is set to 0.1 to 10 μm, the high contact resistance of the base collecting electrode and the emitter layer can be maintained, and the solar cell with the good characteristics can be provided without degrading the characteristics of the solar cell.

Further, it is preferable for a width of the base collecting electrode on the emitter layer to be 0.1 to 10 μm.

As described above, when the film thickness of the base collecting electrode is set to 0.1 to 10 μm, the high contact resistance of the base collecting electrode and the emitter layer can be maintained, and the solar cell with the good characteristics can be provided without degrading the characteristics of the solar cell.

Furthermore, it is preferable for the base collecting electrode to be formed by using a screen printing method.

As described above, the screen printing method enables manufacturing the inexpensive solar cell at the lowest manufacturing cost as an electrode forming method. Moreover, the considerable effect can be provided especially when the screen printing method is applied to the method for manufacturing a solar cell according to the present invention.

Effect of the Invention

According to the solar cell of the present invention, the inexpensive solar cell with the high photoelectric conversion efficiency can be provided. Additionally, according to the method for manufacturing a solar cell of the present invention, the allowable range for the positioning of the base collecting electrode can be increased, and the solar cell with the high photoelectric conversion efficiency can be manufactured while enhancing the productivity and the manufacturing yield.

DESCRIPTION OF EMBODIMENTS

As described above, a positional deviation of a base layer and a base collecting electrode of a solar cell has been a problem in recent years. The present inventors have earnestly examined about a measure to increase an allowable range of such a positional deviation, and brought the present invention to completion.

Although the present invention will now be described hereinafter in detail with reference to the drawings, but the present invention is not restricted thereto.

Figure 3:
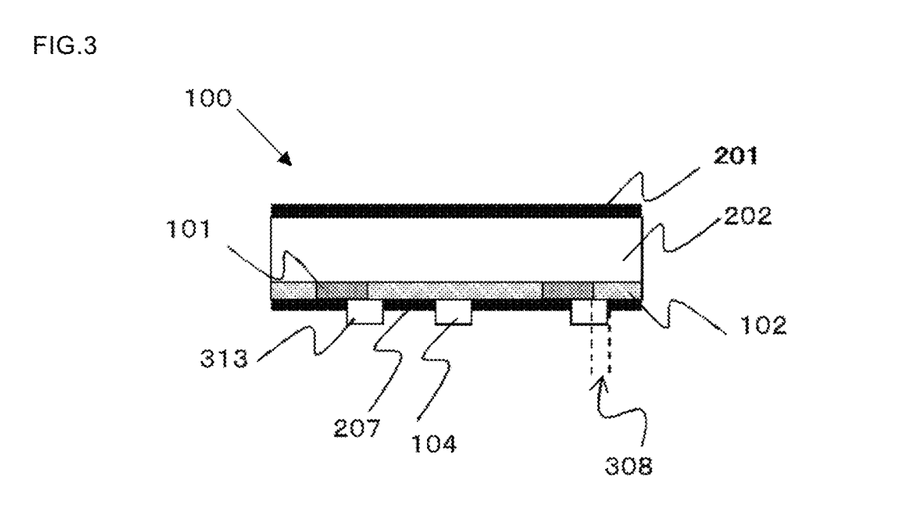
FIG. 3 is a schematic cross-sectional view of a backside contact solar cell according to the present invention.

An N-type substrate will be taken as an embodiment of a solar cell according to the present invention and specifically described hereinafter with reference to FIG. 3. FIG. 3 is a schematic view showing an example of a cross-sectional structure of a solar cell (a backside contact solar cell) according to the present invention. The solar cell 100 shown in FIG. 3 is a solar cell which has base layers 101 having a first conductivity type and an emitter layer 102 which is adjacent to the base layers 101 and has a second conductivity type (a P type in this embodiment) which is a conductivity type opposite to the first conductivity type on a first main surface (a back surface in this embodiment) of a semiconductor substrate 202 having the first conductivity type (an N type in this embodiment), and has base collecting electrodes 313 on at least the respective base layers 101, and a part of the base collecting electrode 313 is also arranged on the emitter layer 102 which is adjacent to the base layer 101 on which the base collecting electrode 313 is arranged.

The solar cell 100 according to the present invention is characterized in that a part of the base electrode 313 is in contact with the adjacent emitter layer 102. In general, when the base electrode is in contact with the emitter layer, this state corresponds to short-circuiting a positive pole and a negative pole, and hence the characteristics of the solar cell are greatly degraded. However, the earnest study of the present inventors has revealed that a contact resistance between the base electrode 313 and the emitter layer 102 is dependent on a film thickness of the base electrode 313 on the emitter layer 102. That is, when the film thickness of the base electrode 313 on the emitter layer 102 is small, the contact resistance increases, and the characteristics of the solar cell are not affected. More specifically, it is preferable for the film thickness of the base electrode 313 on the emitter layer 102 to be 0.1 to 10 μm (0.1 μm or more and 10 μm or less). When the film thickness of the base electrode 313 on the emitter layer 102 is 10 μm or less, the contact resistance between the base electrode 313 and the emitter layer 102 is maintained high, and the characteristics of the solar cell are not lowered. In FIG. 3, a contact portion of the base electrode 313 and the emitter layer 102 is denoted by reference numeral 308.

Further, it is preferable for a width of the base electrode 313 on the emitter layer 102 to be 0.1 to 10 μm (0.1 μm or more and 10 μm or less). When the width of the base electrode 313 on the emitter layer 102 is 10 μm or less, the contact resistance between the base electrode 313 and the emitter layer 102 is maintained high, and the characteristics of the solar cell are not lowered.

Here, the film thickness of the base electrode 313 on the emitter layer 102 can be measured by observing a substrate cross section using, e.g., a microscope or an electron microscope. Furthermore, the width of the base electrode 313 on the emitter layer 102 can be measured by observing a cross section of the solar cell using, e.g., a microscope or an electron microscope. As an easier method, the width of the base layer 101 may be measured in advance, the base electrode 313 may be observed from a substrate upper surface, and its width may be calculated by an arithmetic operation. It is to be noted that, since a boundary of a base region is covered with the electrode and cannot be seen after forming the electrode, the width of the base electrode 313 on the emitter layer 102 cannot be directly measured by the observation from the substrate upper surface.

FIGS. 4(a) and (b) are schematic top views showing an example of a positional relationship between the base regions and the base electrodes of the solar cell (the backside contact solar cell) according to the present invention, in FIG. 4(a), each base electrode 313 deviates toward the upper side from each linear base region 101 and is in contact with the emitter region 102. A schematic view of a cross section A-A' in FIG. 4(a) corresponds to FIG. 3. The present invention can be applied to not only such a linear base region shape but also such a dot-like base region shape as shown in FIG. 4(b). That is, in FIG. 4(b), each base electrode 403 deviates toward a lower right side from each dot-like base region 401, and is in contact with an emitter region 402. A schematic view of a cross section B-B' in FIG. 4(b) corresponds to FIG. 3. In this case, a deviation amount between each base region 401 and each base electrode 403 (a width of the base electrode 403 arranged on the emitter region 402) is a maximum width of a deviating portion of the base region 401 and the base electrode 403. It is to be noted that an emitter electrode 404 is formed on the emitter region 402.

Figure 4:
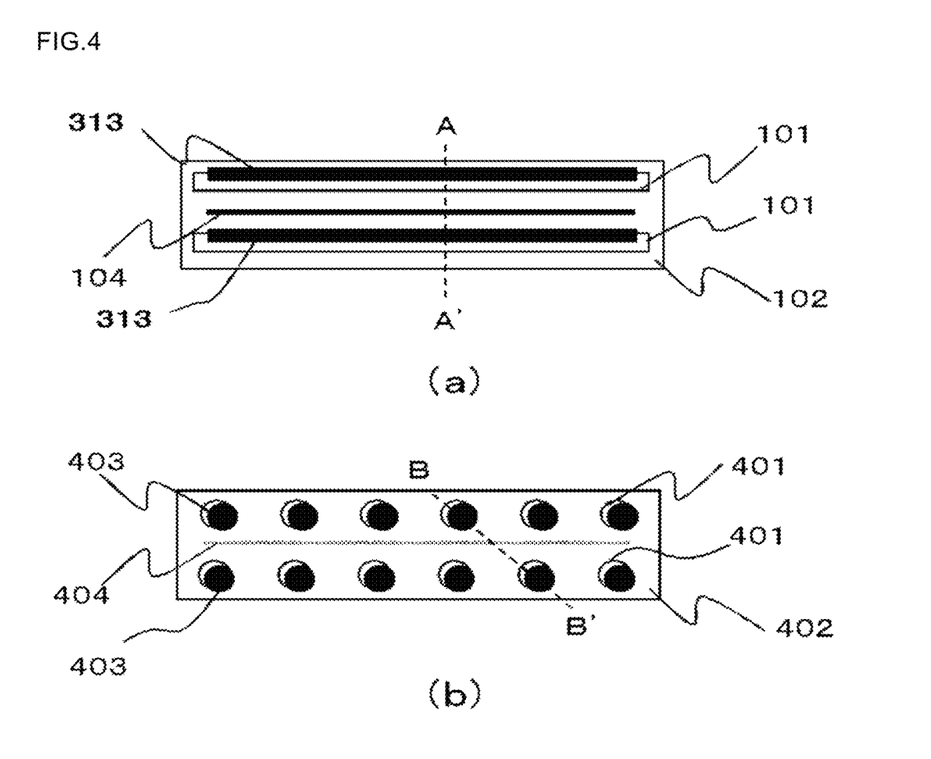
FIG. 4 is a schematic top view showing an example of a positional relationship between a base region and a base electrode of the backside contact solar cell according to the present invention.

As described with reference to FIG. 3 and FIG. 4, adopting a structure where a part of the base electrode is also arranged on the emitter region enables reducing a virtual width of the base electrode conductive with the substrate to be smaller than a width of the actually formed electrode. Consequently, an allowable range of a positional deviation of the base electrode like printing misalignment can be increased.

Moreover, it is preferable for the base region to be arranged at a position recessed from the emitter region on the first main surface. When the base region is arranged at the position recessed from the emitter region, the film thickness of the base electrode on the emitter region is apt to be smaller than the film thickness of the base electrode present on the base region (see later-described FIG. 6), and the width of the base electrode on the emitter region is also apt to be small. Thus, the solar cell with good characteristics can be provided.

Additionally, in a process of manufacturing a solar cell, for example, when a diffusion order of an N-type impurity and a P-type impurity is reversed, the solar cell having the emitter region arranged at a position recessed from the base region on the first main surface can be provided. When an electrode paste is printed on the base region having such a structure, the electrode paste can stay at a step portion to some extent by surface tension. Thus, blur or spread immediately after printing can be readily suppressed, and consequently the base electrodes each having a small width and a small film thickness can be readily formed on the emitter region. Thus, the solar cell with the good characteristics can be provided.

Next, a method for manufacturing a solar cell according to the present invention will now be described. The method for manufacturing a solar cell according to the present invention is a method for manufacturing a solar cell which includes forming a base layer having a first conductivity type and an emitter layer which is adjacent to the base layer and has a second conductivity type which is a conductivity type opposite to the first conductivity type on a first main surface of a semiconductor substrate having the first conductivity type, and forming a base collecting electrode on the base layer, and a part of the base collecting electrode is also formed on the emitter layer adjacent to the base layer at the step of forming the base collecting electrode on the base layer. A case where an N-type semiconductor is used as the semiconductor substrate will be taken as an example, and the method for manufacturing a solar cell according to the present invention will be described hereinafter with reference to FIG. 5.

Figure 5:
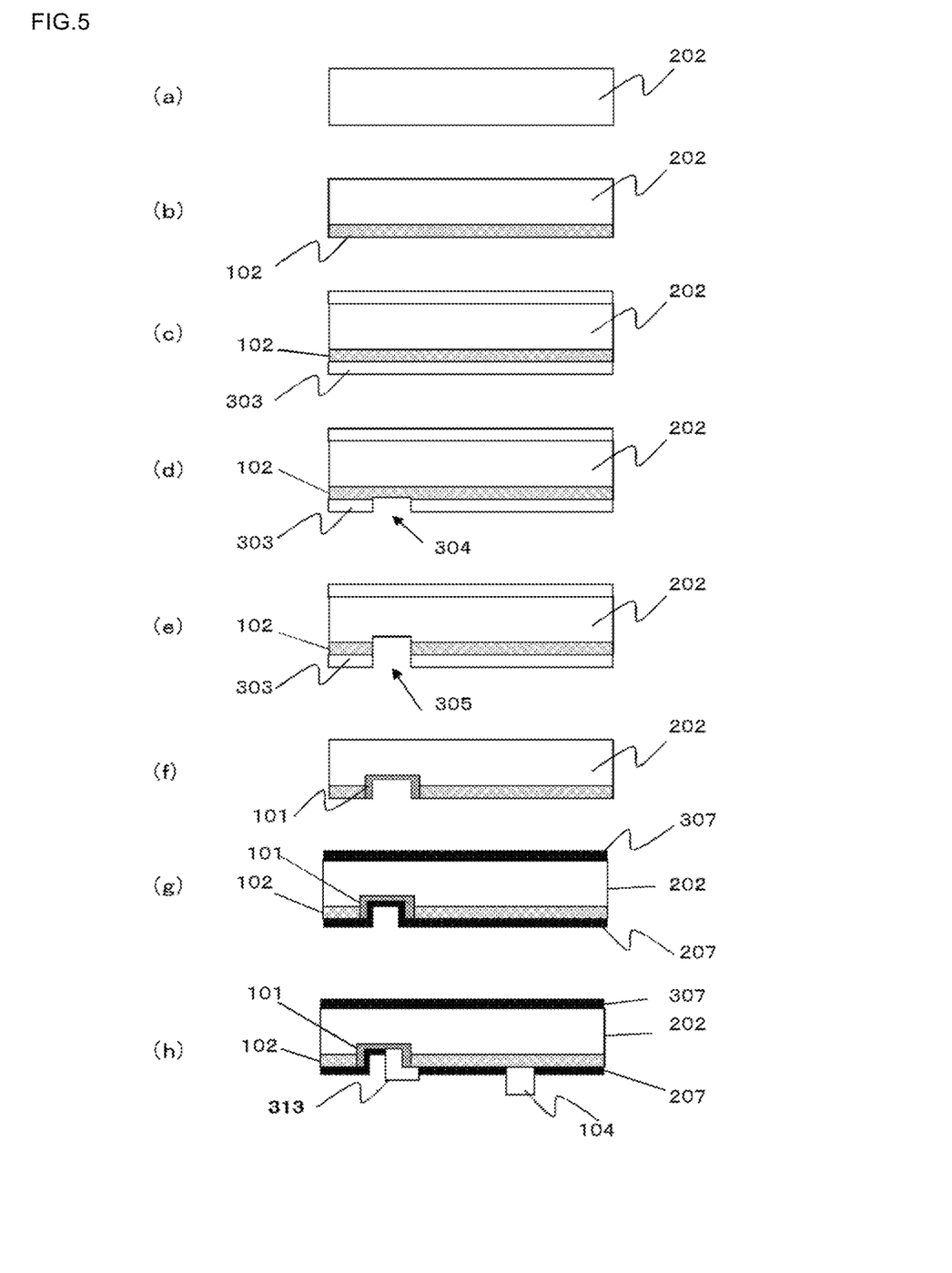
FIG. 5 is a process flowchart showing an example of a method for manufacturing a backside contact solar cell according to the present invention.

First, a semiconductor substrate is prepared. For example, the semiconductor substrate can be prepared as follows. High-purity silicon is doped with group V elements such as phosphorous, arsenic and antimony to prepare an as-cut single crystal {100} N-type silicon substrate 202 having a specific resistance of 0.1 to 5 Ω·cm (a step (a)), and slice damage on a surface is subjected to etching using, e.g., a high-concentration alkali such as sodium hydroxide or potassium hydroxide having concentration of 5 to 60% or a mixed acid of a hydrofluoric acid and a nitric acid. The single-crystal silicon substrate may be fabricated by any one of a CZ (Czochralski) method and an FZ (Floating zone) method. The substrate 202 does not necessarily have to the single-crystal silicon substrate, and it may be a polycrystal silicon substrate.

Subsequently, small irregularities called a texture are formed on a surface of the substrate 202. The texture is an effective method to reduce a reflectance of the solar cell. The texture is fabricated by immersing the substrate 202 into a heated alkali solution (concentration: 1 to 10%, temperature:

60 to 100° C.) such as sodium hydroxide, potassium hydroxide, potassium carbonate, sodium carbonate, or sodium bicarbonate for approximately 10 minutes to 30 minutes. A predetermined amount of 2-propanol may be dissolved in the solution to promote a reaction.

After forming the texture, cleaning is performed in an acid aqueous solution of, e.g., a hydrochloric acid, a sulfuric acid, a nitric acid, or a mixture of these members. Hydrogen peroxide may be mixed to improve cleanliness.

An emitter layer 102 is formed on a first main surface of this substrate 202 (a step (b)). The emitter layer 102 has a conductivity type (a P-type in this example) opposite to that of the substrate 202, and has a thickness of approximately 0.05 to 1 μm. The emitter layer 102 can be formed by vapor phase diffusion using $BBr_3$ or the like. Specifically, the substrate 202 is put into a heat treatment furnace in a state where two substrates 202 are overlapped as a pair, a mixed gas of $BBr_3$ and oxygen is introduced, and a heat treatment is performed at 950 to 1050° C. As a carrier gas, nitrogen or argon is preferable. Further, the emitter layer 102 can be likewise formed by a method for applying a coating agent containing a boron origin to the entire first main surface and performing the heat treatment at 950 to 1050° C. As the coating agent, for example, it is possible to use an aqueous solution containing 1 to 4% of boron as the boron origin and 0.1 to 4% of polyvinyl alcohol as a thickener.

After forming the emitter 102, a mask 303 for formation of a base layer as a subsequent step is formed on both main surfaces of the substrate 202 (a step (c)). As the mask 303, a silicon oxide film, a silicon nitride film, or the like as a dielectric film can be used. When the CVD method is adopted, appropriately selecting a gas type to be introduced enables forming any film. In case of the silicon oxide film, this film can be formed by thermally oxidizing the substrate 202. In this case, when the substrate 202 is subjected to the heat treatment in an oxygen atmosphere at 950 to 1100° C. for 30 minutes to 4 hours, a silicon thermal oxide film of approximately 100 nm is formed. This heat treatment may be carried out in the same batch following the heat treatment for formation of the emitter layer 102.

Then, the mask in each part which serves as a region of a base layer 101 is partially removed (opened) to form each opening portion 304 (a step (d)). Specifically, the opening portion 304 can be formed into a parallel line shape so that an opening width of the opening portion 304 becomes 50 μm or more and 250 μm or less and an interval between the opening portions 304 becomes 0.6 mm or more and 2.0 mm or less. To open the mask 303, a photolithography method or a method for performing chemical etching with an etching paste can be used. Furthermore, a method for physical opening with the use of, e.g., a laser or a dicer may be also used.

After forming each opening portion 304 in the mask 303, the substrate 202 is immersed in an alkali aqueous solution of, e.g., KOH or NaOH heated to 50 to 90° C. to remove (etch) the unnecessary emitter layer 102 at the opening portion 304 (a step (e)). Consequently, an opening portion 305 from which the emitter layer has been removed is formed.

Subsequently, the base layer 101 is formed (a step (f)). To form the base layer 101, a vapor phase diffusion method using phosphorus oxychloride can be used. When the substrate 202 is heat-treated in a mixed gas atmosphere of the phosphorus oxychloride, nitrogen, and oxygen at 830 to 950° C., a phosphorus diffused layer (an $N^+$ layer) which functions as the base layer 101 is formed. Besides the vapor phase diffusion method, the base layer 101 can be likewise formed by a method for spin-coating a material containing the phosphorus or performing a heat treatment after printing. After forming the base layer 101, the mask 303 and glass formed on the surface are removed by using a hydrofluoric acid or the like.

Then, an antireflection film 307 is formed on a second main surface which is a main surface opposed to the first main surface (a step (g)). As the antireflection film 307, a silicon nitride film, a silicon oxide film, or the like can be used. In case of the silicon nitride film, a plasma CVD apparatus is used to form the film with a film thickness of approximately 100 nm. As a reactant gas, monosilane ($SiH_4$) and ammonia ($NH_3$) are often mixed and used, but nitrogen can be used in place of $NH_3$. Further, to adjust a process pressure, dilute the reactant gas, and promote a bulk passivation effect of the substrate when the polycrystal silicon is used for the substrate, hydrogen is mixed in the reactant gas in some cases. On the other hand, in case of the silicon oxide film, the film can be formed by the CVD method, but higher characteristics can be provided from a film formed by a thermal oxidation method.

On the first main surface, the silicon nitride film or the silicon oxide film can be used as a backside top coat 207. It is preferable to set a film thickness of the backside top coat 207 to 50 to 250 nm. Like the second main surface (a light receiving surface) side, the backside top coat 207 can be formed by the CVD method in case of the silicon nitride film, and the same can be formed by the thermal oxidation method or the CVD method in case of the silicon oxide film. Furthermore, to enhance a protection effect of the surface, an aluminum oxide film may be formed on the substrate surface in advance, and then the silicon nitride film, the silicon oxide film, or the like may be formed.

Subsequently, an electrode is formed along the base layer 101. This electrode formation can be carried out as follows. A base electrode 313 is formed by, e.g., the screen printing method (a step (h)). For example, a plate having an opening width of 30 μm or more and 100 μm or less and a parallel line pattern with intervals of 0.6 to 2.0 mm can be prepared in advance, and an Ag paste provided by mixing Ag powder and glass frit with an organic binder can be printed along the base layer 101.

In general, positioning of the base layer and the base electrode is not easy. That is because deviation factors, e.g., a positional deviation at the time of processing the base region, a positional deviation at the time of electrode printing, a plate elongation, and others overlap, and then the electrode is formed. However, according to the method for manufacturing a solar cell of the present invention, even if a part of the base electrode 313 is formed on the emitter layer 102, the characteristics of the solar cell are not affected. In particular, if the base electrode 313 on the emitter layer 102 has a small film thickness, a contact resistance remains high, and the characteristics of the solar cell are not affected. Specifically, it is preferable for the film thickness of the base electrode on the emitter layer 102 to be 0.1 to 10 μm. Further, it is preferable for a width of the base electrode on the emitter layer 102 to be 0.1 to 10 μm. When the configuration is adopted, the width of the virtual base electrode which is conductive with the substrate is smaller than a width of the actually formed base electrode 313, and an allowable range of the printing deviation can be increased. Furthermore, in the screen printing method, a plate elongation amount is different according to a position even in the same plate, a positional deviation between the base collecting electrode and the base layer is apt to generate according to a position on the semiconductor substrate, and hence an effect is profound particularly when this method is applied to the method for manufacturing a solar cell of the present invention.

Figure 6:
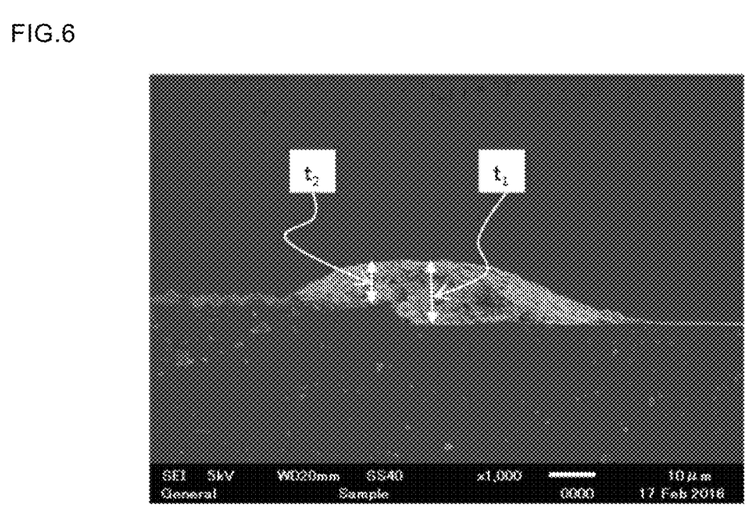
FIG. 6 is an electron micrograph of a cross section of the backside contact solar cell according to the present invention.

Moreover, according to the method, since the mask 303 is opened and then etched, the base region 101 is formed at a position recessed from the emitter region 102. Thus, the film thickness of the base electrode on the emitter region 102 is necessarily smaller than the film thickness of the base electrode on the base region 101. FIG. 6 shows such an example. FIG. 6 is an electron micrograph of a cross section near the base electrode formed through the steps. It can be understood that a film thickness $t_2$ on the emitter region is smaller than a film thickness $t_1$ on the base region.

Additionally, contrary to the method, when the base layer and the emitter layer are formed based on a method by which the order of phosphorus diffusion and boron diffusion is reversed, the emitter region is formed at a position recessed from the base region. When an electrode paste is printed on the base region in this structure, the electrode paste can stay at a step portion to some extent by the surface tension. Thus, blur or spread immediately after printing can be readily suppressed, and consequently the solar cell in which the base electrode on the emitter has a small width and a small film thickness can be formed.

Following the formation of the base electrode 313, an Ag paste is printed as an emitter electrode 104. The Ag paste for the base electrode 313 and the Ag paste for the emitter electrode 104 may be the same, or different pastes may be used. After the electrode printing, Ag powder is penetrated through (fire-through) the silicon nitride film or the like by a heat treatment so that the electrode can be conducive with silicon present thereunder. It is to be noted that the base electrode 313 and the emitter electrode 104 may be separately baked. Baking is usually achieved by performing a treatment at a temperature of 700 to 850° C. or less for one to five minutes.

Although the example of the N-type substrate has been described above, in case of a P-type substrate, phosphorus, arsenic, antimony, or the like could be diffused in the formation of the emitter layer, boron, Al, or the like could be diffused in the formation of the base layer, and it is obvious that the P-type substrate can be applied to the method for manufacturing a solar cell and the solar cell according to the present invention.

Figure 8:
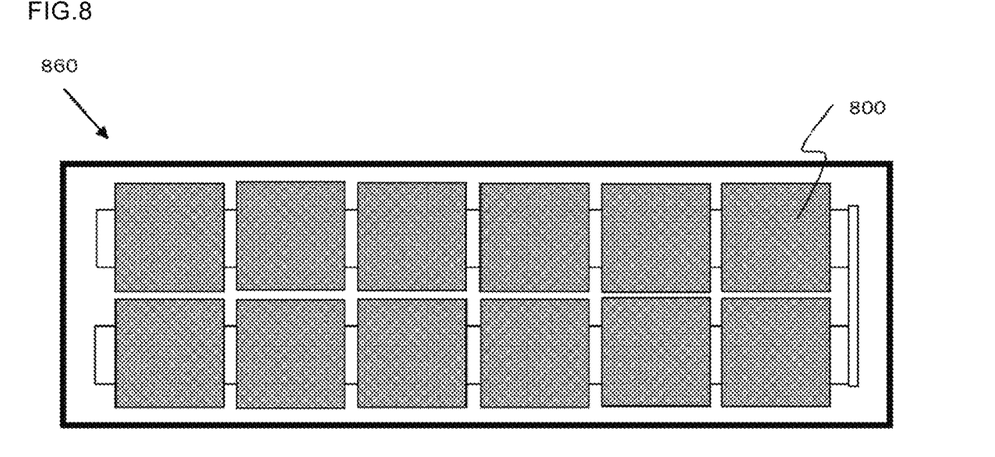
FIG. 8 is an overview diagram of a photovoltaic module according to the present invention.

The solar cell according to the present invention can be included in a photovoltaic module. FIG. 8 shows an overview of an example of the photovoltaic module having the solar cell according to the present invention built-in. Although FIG. 8 shows an example of the photovoltaic module having the backside contact solar cell built-in, the present invention is not restricted thereto, and a photovoltaic module having a solar cell of a different type according to the present invention built-in may be provided. The solar cells 800 according to the present invention are configured in such a manner that they are laid like tiles within a photovoltaic module 860.

Figure 9:
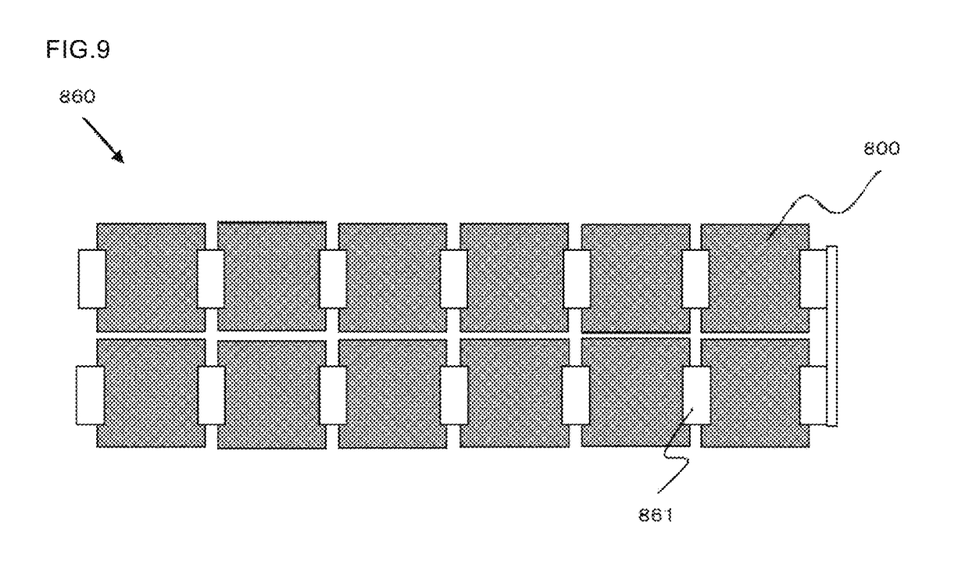
FIG. 9 is a schematic view of a back surface inside the photovoltaic module according to the present invention.

In the photovoltaic module 860, several to tens of solar cells 800 adjacent to each other are electrically connected in series and constitute a series circuit called a string. FIG. 9 shows an overview of the string. FIG. 9 corresponds to a schematic view of a back surface side in the module which cannot be usually seen. Further, a finger electrode or a bus bar is not shown. To achieve the series connection, as shown in FIG. 9, a P bus bar (a bus bar electrode connected to the finger electrode joined to a P-type layer of a substrate) and an N bus bar (a bus bar electrode connected to the finger electrode joined to an N-type layer of the substrate) of the adjoining solar cells 800 are connected to each other through a tab lead wire 861 or the like.

Figure 10:
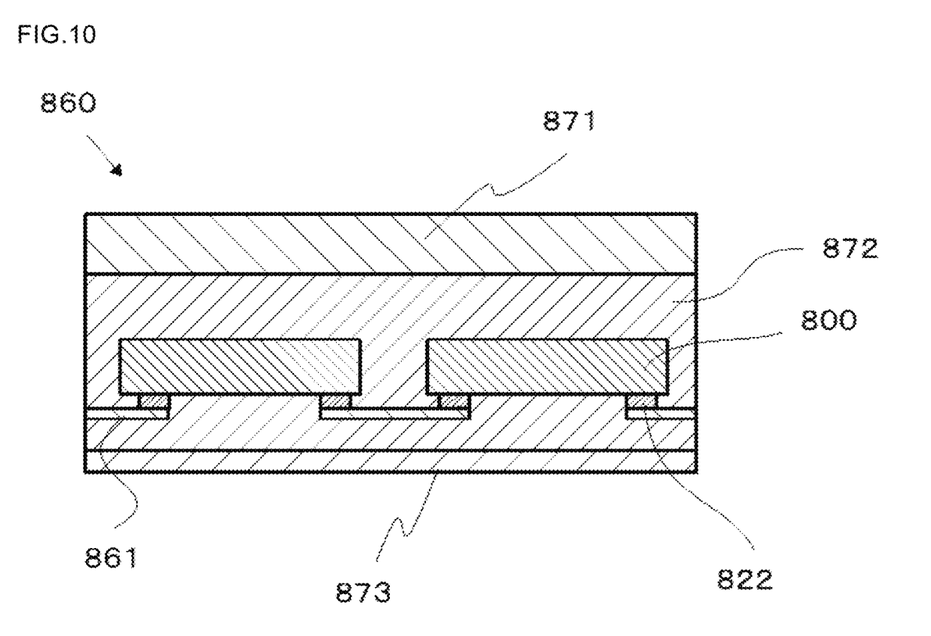
FIG. 10 is a schematic cross-sectional view of the photovoltaic module according to the present invention.

FIG. 10 shows a schematic cross-sectional view of the photovoltaic module 860. As described above, the string is constituted by connecting the plurality of solar cells 800 to the lead wires 861 through bus bar electrodes 822. The string is usually sealed with a filler 872 having translucency such as EVA (ethylene vinyl acetate), and a non-light receiving surface side is covered with a weatherable resin film 873 such as PET (polyethylene terephthalate), and a light receiving surface is covered with a light receiving surface protective material 871 having translucency and high mechanical strength such as soda-lime glass. As the filler 872, besides the EVA, polyolefin, silicone, or the like can be used.

Figure 11:
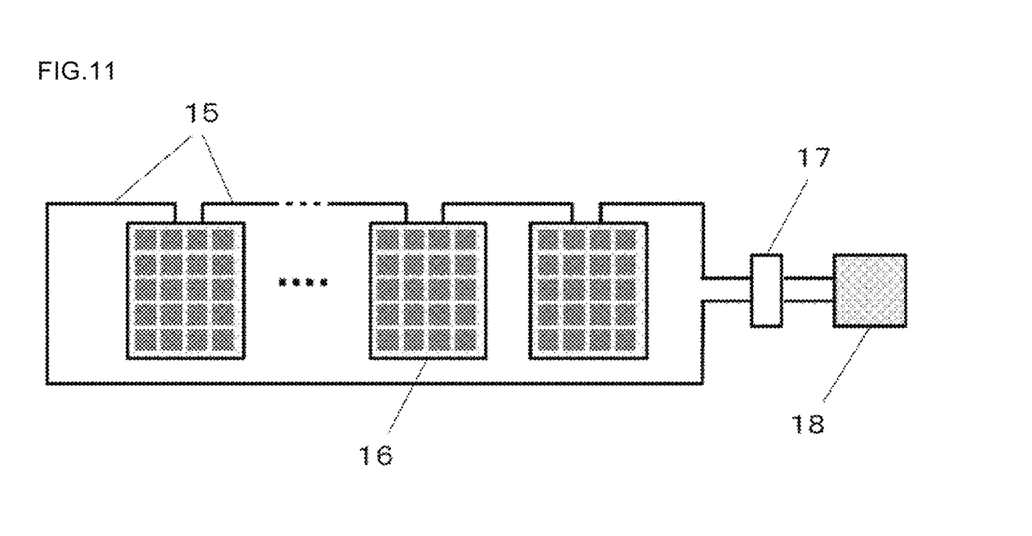
FIG. 11 is a schematic view of a photovoltaic power generation system according to present invention.

Moreover, a photovoltaic power generation system can be manufactured and configured by using this module. FIG. 11 shows a basic structure of the photovoltaic power generation system having the modules according to the present invention coupled with each other. A plurality of photovoltaic modules 16 are coupled in series through wirings 15, and generated electric power is supplied to an external load circuit 18 through an inverter 17. Although not shown in FIG. 11, the system may further include a secondary cell which stores the generated electric power.

EXAMPLES

The present invention will now be more specifically described hereinafter with reference to an example and a comparative example, but the present invention is not restricted thereto.

Example

A solar cell was fabricated by using the method for manufacturing a solar cell according to the present invention. First, many phosphorus-doped {100} N-type as-cut silicon substrates each having a thickness of 200 μm and a specific resistance of 1 Ω·cm were prepared. Then, a damage layer of each of the silicon substrates was removed by a hot concentrated potassium hydroxide solution. Thereafter, each substrate was immersed into a potassium hydroxide/2-propanol solution of 72° C. to form a texture, and then it was cleaned in a hydrochloric acid/hydrogen peroxide mixed solution heated to 75° C.

Subsequently, a P-type diffusion layer (an emitter layer) was formed on the substrate. The two substrates were overlapped as a pair and put into a heat treatment furnace in this state, a mixed gas of $BBr_3$, oxygen and argon was introduced, and a heat treatment was carried out at 1000° C. for 10 minutes. As a result of measuring the P-type diffusion layer formed on the substrate by a four-point probe method, a sheet resistance was 50Ω.

This substrate was thermally oxidized in an oxygen atmosphere at 1000° C. for three hours to form a mask on a substrate surface. The mask on the back surface of the substrate was opened by a laser. As a laser source, a second harmonic wave of $Nd:YVO_4$ was used. As an opening pattern, a parallel line shape having intervals of 1.2 mm was used. The substrate having the opening portion formed therein was immersed in a KOH aqueous solution of 80° C., and the emitter layer at the opening portion was removed.

Then, in a phosphorus oxychloride atmosphere, the light receiving surfaces of the substrates were overlapped and heat-treated at 870° C. for 40 minutes in this state to form a phosphorus diffusion layer (a base layer) at the opening portion. Thereafter, this substrate was immersed into a hydrofluoric acid having concentration of 12% to remove the mask and glass on the surface.

After the treatment, a silicon nitride film was formed on both surfaces of the substrate with the use of a plasma CVD apparatus. A film thickness of the silicon nitride film was set to 100 nm on both the front and back surfaces. At this point of time, the substrate was observed from above by a microscope, and a width of the base layer was measured. The plurality of substrates were measured, and the base layer had the width of approximately 190 μm in all the substrates.

Then, an Ag paste was printed on the base layer and dried. At this time, a reference position of printing was gradually changed, the base electrode was intentionally shifted from the base region, and the printing was performed. Further, at the same time, to confirm an influence of the film thickness, three types of plates having (1) a plate mesh 325 and an emulsion thickness 30 μm, (2) a plate mesh 325 and an emulsion thickness 15 μm, and (3) a plate mesh 500 and an emulsion thickness 5 μm were prepared, and printing was performed with the use of the respective plates.

At last, an Ag paste was printed on the emitter layer and dried, and this was baked in an air atmosphere at 780° C.

Current-voltage characteristics of each of the thus-obtained solar cell samples were measured by using a solar simulator manufactured by Yamashita Denso Corporation under conditions of an AM 1.5 spectrum, irradiation intensity of 100 mW/cm$^2$, and 25° C., and photoelectric conversion efficiency was thereby obtained. Furthermore, each substrate was observed from above by a microscope, and a base electrode width on the emitter layer was calculated by using a base layer width 190 μm measured in advance. 9 points were observed per substrate, and an average value of these points was determined as a representative value of the substrate. A film thickness was measured by observing a substrate cross section with the use of an electron microscope.

Figure 7:
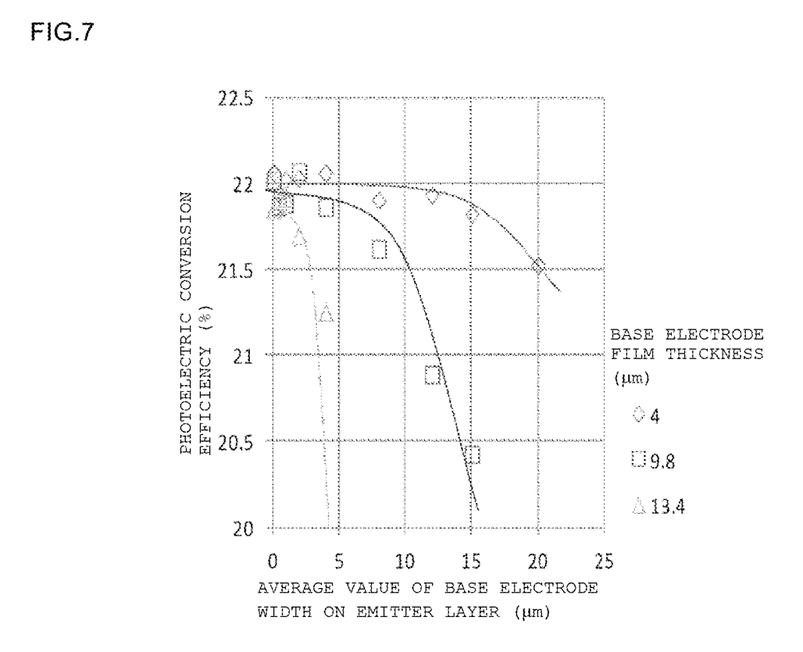
FIG. 7 is a view showing a relationship between a base electrode width average value on an emitter region and photoelectric conversion efficiency of the backside contact solar cell according to the present invention.

FIG. 7 shows a relationship between the base electrode width average value on the emitter layer and the photoelectric conversion efficiency of data acquired by the method. In all the fabricated solar cells, the photoelectric conversion efficiency of 20.4% or more was obtained. Further, in a case where the film thickness of the base electrode on the emitter layer was as small as 4 μm, the photoelectric conversion efficiency was not lowered when the width of the base electrode on the emitter layer was 15 μm or less. Furthermore, in a case where the film thickness of the base electrode on the emitter layer was 9.8 μm, the photoelectric conversion efficiency was hardly lowered till the width of the base electrode on the emitter layer was nearly 10 μm. Moreover, in a case where the film thickness of the base electrode on the emitter layer was 13.4 μm, the photoelectric conversion efficiency was lowered even when a deviation was relatively small. If the film thickness of the base electrode on the emitter layer was approximately 10 μm, the photoelectric conversion efficiency was hardly lowered when the width of the base electrode on the emitter region was approximately 10 μm or less.

It is to be noted that the present invention is not restricted to the foregoing embodiment. The foregoing embodiment is an illustrative example, and any example which has substantially the same configuration and exerts the same functions and effects as the technical concept described in claims according to the present invention is included in the technical scope of the present invention.

The invention claimed is:

1. A solar cell comprising, on a first main surface of a semiconductor substrate having a first conductivity type: a base layer which has the first conductivity type; and an emitter layer which is adjacent to and is in contact with the base layer and has a second conductivity type which is a conductivity type opposite to the first conductivity type, and further comprising a base collecting electrode provided on at least the base layer,
   wherein a part of the base collecting electrode is also arranged on the emitter layer so as to be in contact with the emitter layer adjacent to and is in contact with the base layer on which the base collecting electrode is arranged,
   wherein the emitter layer is arranged at a position recessed further into the first main surface than the base layer, and
   wherein the base collecting electrode is formed from the bottom of the recessed position to out of the recessed position.

2. The solar cell according to claim 1,
   wherein a film thickness of the base collecting electrode arranged on the emitter layer is 0.1 to 10 μm.

3. The solar cell according to claim 1,
   wherein a width of the base collecting electrode arranged on the emitter layer is 0.1 to 10 μm.

4. The solar cell according to claim 2,
   wherein a width of the base collecting electrode arranged on the emitter layer is 0.1 to 10 μm.

5. A photovoltaic module comprising the solar cell according to claim 1 included therein.

6. A photovoltaic power generation system comprising the photovoltaic module according to claim 5.

7. The solar cell according to claim 1,
   wherein a surface of a non-electrode region on the first main surface is covered with a backside top coat.

* * * * *